United States Patent
Chen et al.

(10) Patent No.: US 9,343,552 B2
(45) Date of Patent: May 17, 2016

(54) FINFET WITH EMBEDDED MOS VARACTOR AND METHOD OF MAKING SAME

(71) Applicant: Taiwan Semiconductor Manufacturing Company, Ltd., Hsin-Chu (TW)

(72) Inventors: Wan-Te Chen, Danshui Township (TW); Chung-Hui Chen, Hsin-Chu (TW); Jaw-Juinn Horng, Hsin-Chu (TW); Po-Zeng Kang, Hsin-Hua (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/719,090

(22) Filed: May 21, 2015

(65) Prior Publication Data

US 2015/0270368 A1    Sep. 24, 2015

Related U.S. Application Data

(63) Continuation of application No. 13/715,684, filed on Dec. 14, 2012, now Pat. No. 9,064,725.

(51) Int. Cl.

| | |
|---|---|
| H01L 27/088 | (2006.01) |
| H01L 29/78 | (2006.01) |
| H01L 29/93 | (2006.01) |
| H01L 29/66 | (2006.01) |
| H01L 27/02 | (2006.01) |
| H01L 27/06 | (2006.01) |
| H01L 27/092 | (2006.01) |
| H01L 27/12 | (2006.01) |
| H01L 21/8234 | (2006.01) |

(52) U.S. Cl.
CPC .... *H01L 29/6681* (2013.01); *H01L 21/823418* (2013.01); *H01L 21/823431* (2013.01); *H01L 27/0207* (2013.01); *H01L 27/0629* (2013.01); *H01L 27/0886* (2013.01); *H01L 27/0924* (2013.01); *H01L 27/1211* (2013.01); *H01L 29/66174* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 7,115,920 | B2 | 10/2006 | Bernstein et al. |
| 7,241,649 | B2 | 7/2007 | Donze et al. |
| 2008/0185650 | A1 | 8/2008 | Chen et al. |
| 2010/0025767 | A1 | 2/2010 | Inaba |
| 2011/0291166 | A1 | 12/2011 | Booth, Jr. et al. |
| 2012/0223392 | A1 | 9/2012 | Okada |

(Continued)

FOREIGN PATENT DOCUMENTS

| | | |
|---|---|---|
| JP | 2010040630 A | 2/2010 |
| TW | I283925 B | 7/2007 |

(Continued)

*Primary Examiner* — Robert Bachner
*Assistant Examiner* — Molly Reida
(74) *Attorney, Agent, or Firm* — Slater Matsil, LLP

(57) ABSTRACT

Embodiments of the present disclosure are a semiconductor device, a FinFET device, and a method of forming a FinFET device. An embodiment is semiconductor device including a first FinFET over a substrate, wherein the first FinFET includes a first set of semiconductor fins. The semiconductor device further includes a first body contact for the first FinFET over the substrate, wherein the first body contact includes a second set of semiconductor fins, and wherein the first body contact is laterally adjacent the first FinFET.

20 Claims, 12 Drawing Sheets

(56) References Cited

U.S. PATENT DOCUMENTS

| | | |
|---|---|---|
| 2012/0261756 A1 | 10/2012 | Kanike et al. |
| 2013/0193526 A1 | 8/2013 | Lo et al. |
| 2013/0309832 A1 | 11/2013 | Cheng et al. |
| 2013/0334614 A1 | 12/2013 | Liaw |
| 2014/0042547 A1 | 2/2014 | Khakifirooz et al. |

FOREIGN PATENT DOCUMENTS

| | | |
|---|---|---|
| TW | I344700 B | 7/2011 |
| TW | I351714 B | 11/2011 |

US 9,343,552 B2

FINFET WITH EMBEDDED MOS VARACTOR AND METHOD OF MAKING SAME

PRIORITY CLAIM AND CROSS-REFERENCE

This application is a continuation of U.S. patent application Ser. No. 13/715,684, entitled "FinFET with Embedded MOS Varactor and Method of Making Same" filed on Dec. 14, 2012, which application is hereby incorporated herein by reference.

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred. The increase in gate widths, however, conflicts with the requirements of reducing the sizes of semiconductor devices. Fin field-effect transistors (FinFET) were thus developed.9150

In state-of-the-art circuits, the operational frequency of the integrated circuit is in the order of several hundreds of megahertz (MHz) to several giga-hertz (GHz). In such circuits, the rising time of clock signals is very short, so that voltage fluctuations in the supply line can be very large. Undesired voltage fluctuations in the power supply line powering a circuit can cause noise on its internal signals and degrade noise margins. The degradation of noise margins can reduce circuit reliability or even cause circuit malfunction.

To reduce the magnitude of voltage fluctuations in the power supply lines, filtering, or decoupling capacitors may be used. Decoupling capacitors act as charge reservoirs that additionally supply currents to circuits when required to prevent momentary drops in supply voltage.

In an attempt to incorporate the decoupling capacitor with the other circuitry, the decoupling capacitor has been placed on-chip. One attempt at using an on-chip decoupling capacitor utilizes a thin-film planar capacitor. These capacitors, however, generally require large areas and are difficult to design and fabricate such that the capacitors have a sufficiently large enough capacitance.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1:
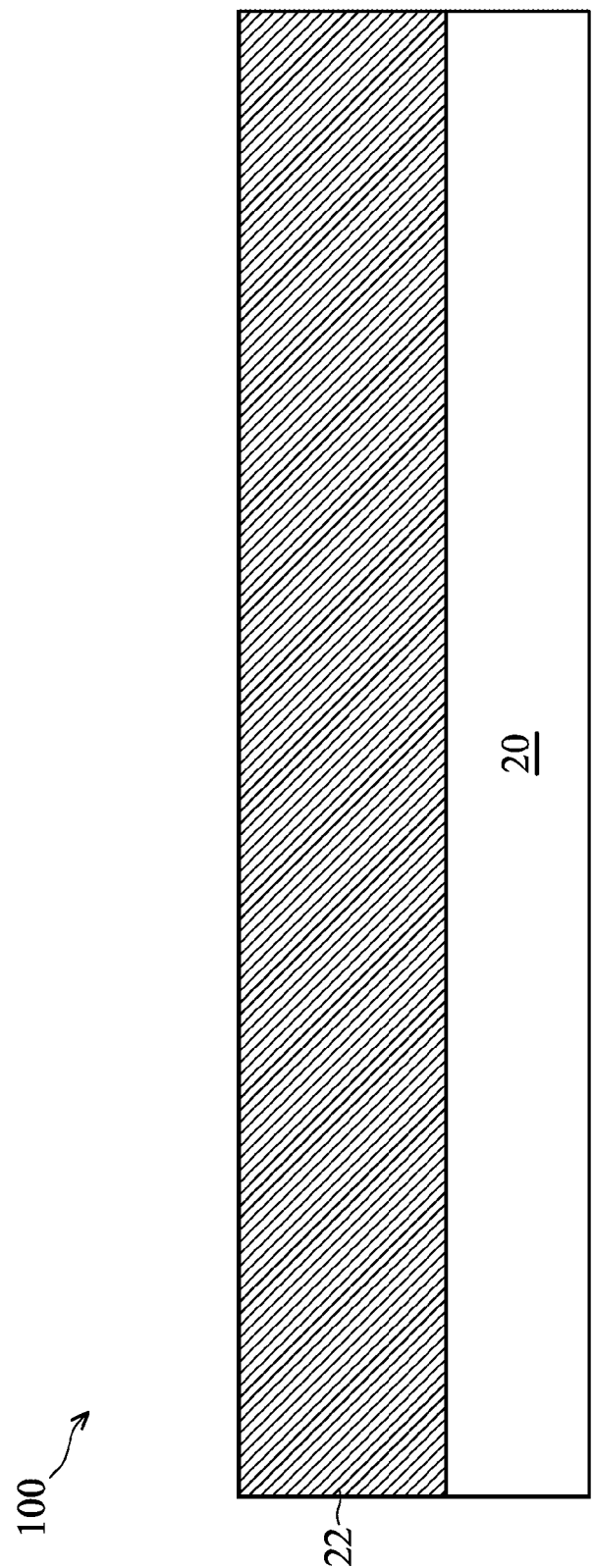
FIGS. 1 through 5B illustrate in cross-sectional and top down views various stages in the manufacture of a FinFET device structure according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a FinFET device with a body contact. Other embodiments may also be applied, however, to other devices with a FinFET structure with an embedded varactor.

FIG. 1 illustrates a cross-sectional view of a FinFET device 100 at an intermediate stage of processing. The FinFET device 100 includes a semiconductor layer 22 on a semiconductor substrate 20. The semiconductor substrate 20 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 20 may include active devices (not shown in FIG. 1 for clarity). As one of ordinary skill in the art will recognize, a wide variety of devices such as transistors, capacitors, resistors, combinations of these, and the like may be used to generate the structural and functional requirements of the design for the FinFET device 100. The devices may be formed using any suitable methods. The active FinFETs 28 may be electrically coupled to the active and passive devices. Only a portion of the semiconductor substrate 20 is illustrated in the figures, as this is sufficient to fully describe the illustrative embodiments.

The semiconductor layer 22 may be formed of semiconductor material such as silicon, germanium, silicon germanium, or the like. In an embodiment, the semiconductor layer 22 is silicon. The semiconductor layer 22 may then doped through an implantation process to introduce p-type or n-type impurities into the semiconductor layer 22.

Figure 2A:
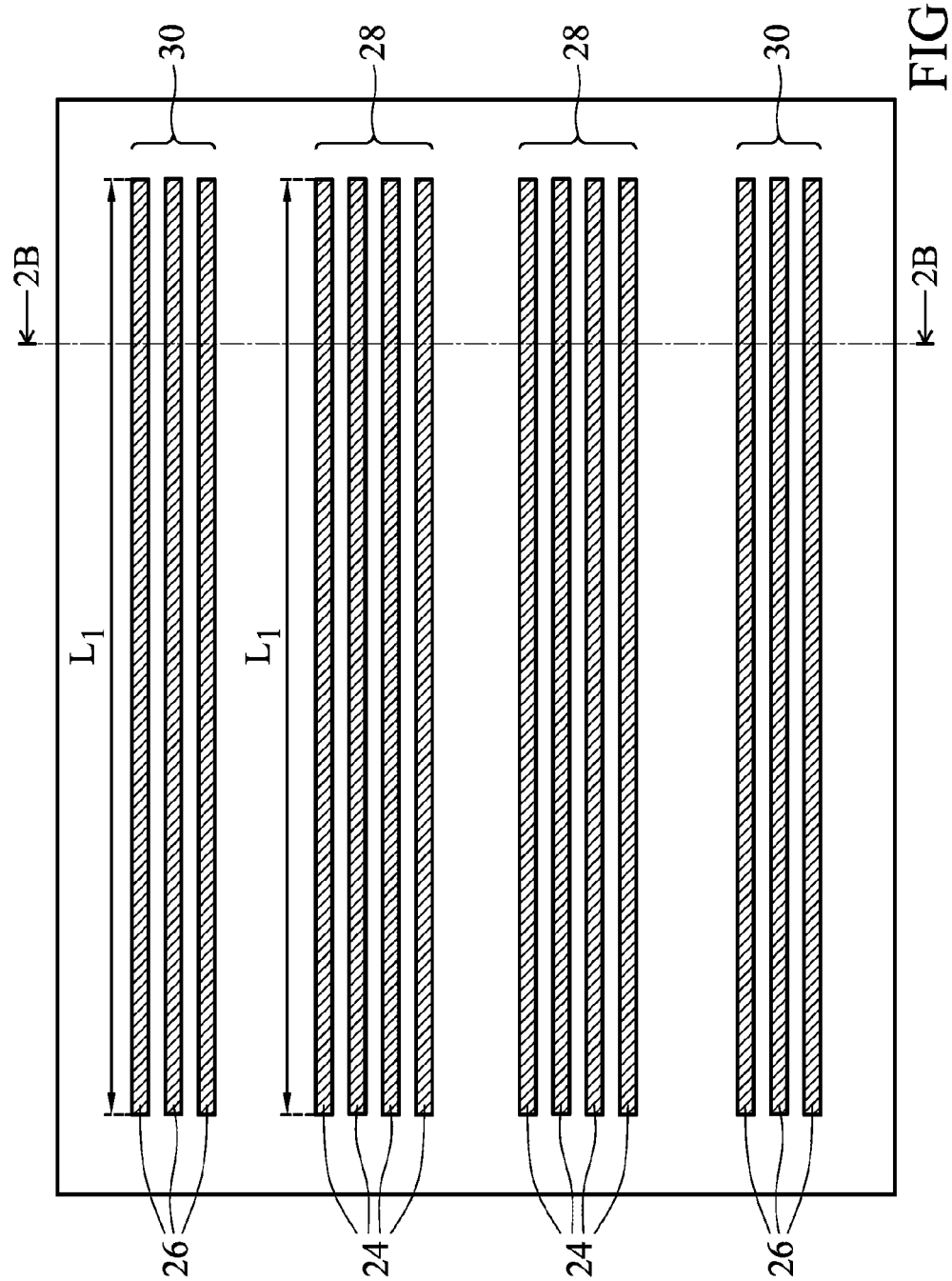
Figure 2B:
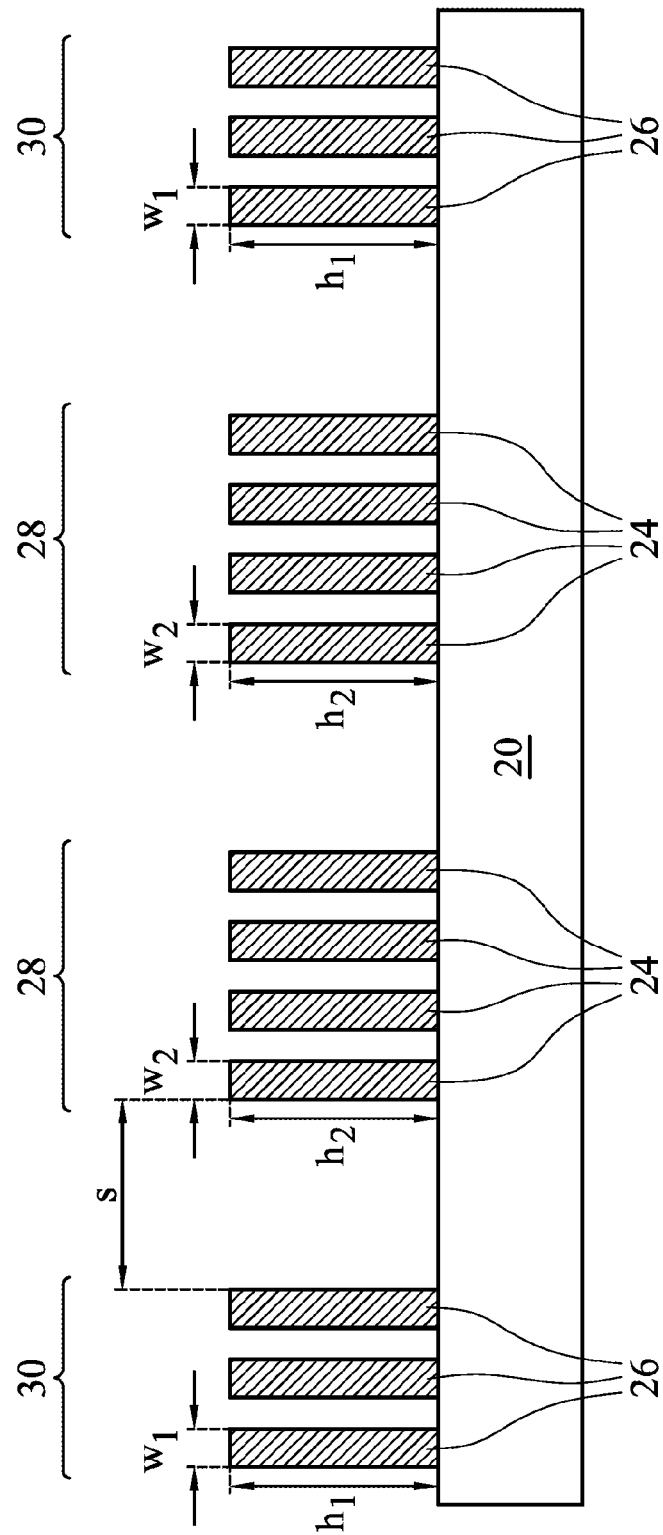
Figure 3A:
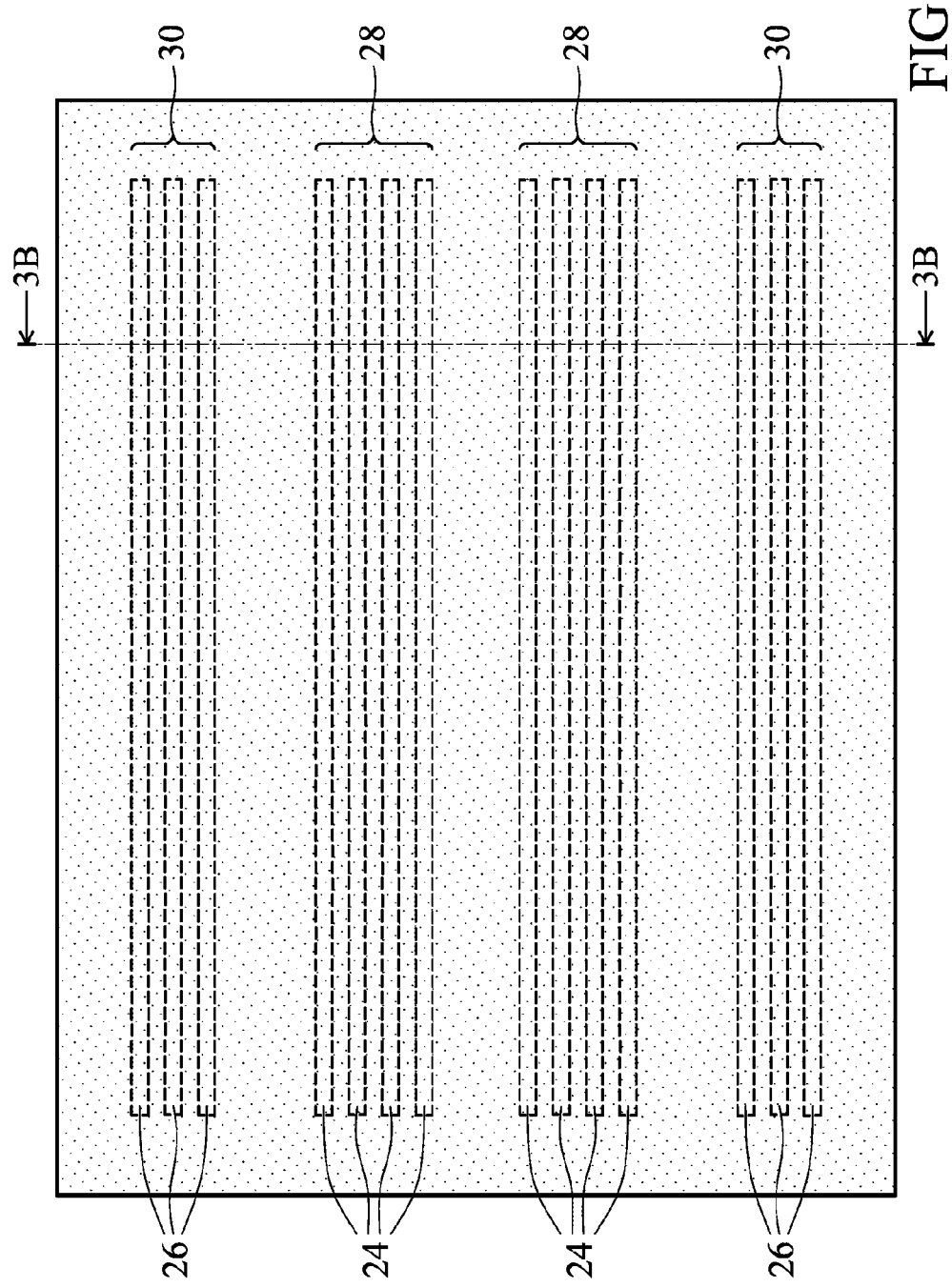

In FIGS. 2A and 2B, the patterning of the semiconductor layer 22 into the active fins 24 and the body contact fins 26 is illustrated. FIG. 2A is a top-down view of FinFET device 100 and FIG. 2B is a cross-sectional view along line 2B in FIG. 2A. The fin patterning process may be accomplished by depositing mask material (not shown) such as photoresist or silicon oxide over the semiconductor layer 22. The mask material is then patterned and the semiconductor layer 22 is etched in accordance with the pattern. The resulting structure includes a plurality of active fins 24 and body contact fins 26 formed in the semiconductor layer 22. Each fin of the plurality of active fins 24 and body contact fins 26 has a sidewall being substantially orthogonal to a top surface of the semiconductor substrate 20. In some embodiments, the semiconductor layer 22 is etched to a specific depth, meaning the active fins 24 and the body contact fins 26 are formed to a height, the active fins 24 height $h_2$ from about 10 nm to about 500 nm and the body contact fins 26 height $h_1$ from about 10 nm to 500 nm. In one specific embodiment, the active fins 24 are formed to a height $h_2$ of about 110 nm and the body contact fins 26 are formed to a height $h_1$ of about 110 nm. The active fins 24 may have a width $w_2$ from about 5 nm to 50 nm and the body contact fins 26 may have a width $w_1$ from about 5 nm to 50 nm. As shown in FIG. 3a, the active fins 24 may have a length $L_1$ from about 0.01 μm to 10 μm and the body contact fins 26 may have a length $L_1$ from about 0.1 μm to 10 μm. In an alternative embodiment, active fins 24 and body contact fins 26 may be epitaxially grown from a top surface of the semiconductor substrate 20 within trenches or openings formed in a patterned layer atop the semiconductor substrate 20. Because the process is known in the art, the details are not repeated herein.

The active fins 24 serve as the fin structure for the to-be-formed FinFETs 28 and the body contact fins 26 serve as the fin structure for the body contacts 30. Each FinFET 28 may comprise a single active fin 24 to as many active fins 24 as necessary for the FinFET device 100. FIGS. 1 through 5B illustrate the formation of two FinFETs 28, each with four active fins 24 as a non-limiting illustrative embodiment. Similarly, the body contacts 30 may comprise a single body contact fin 26 to as many body contact fins 26 as necessary for the FinFET device 100 rather than the three body contact fins 26 illustrated in FIGS. 2A through 5B.

Figure 3B:
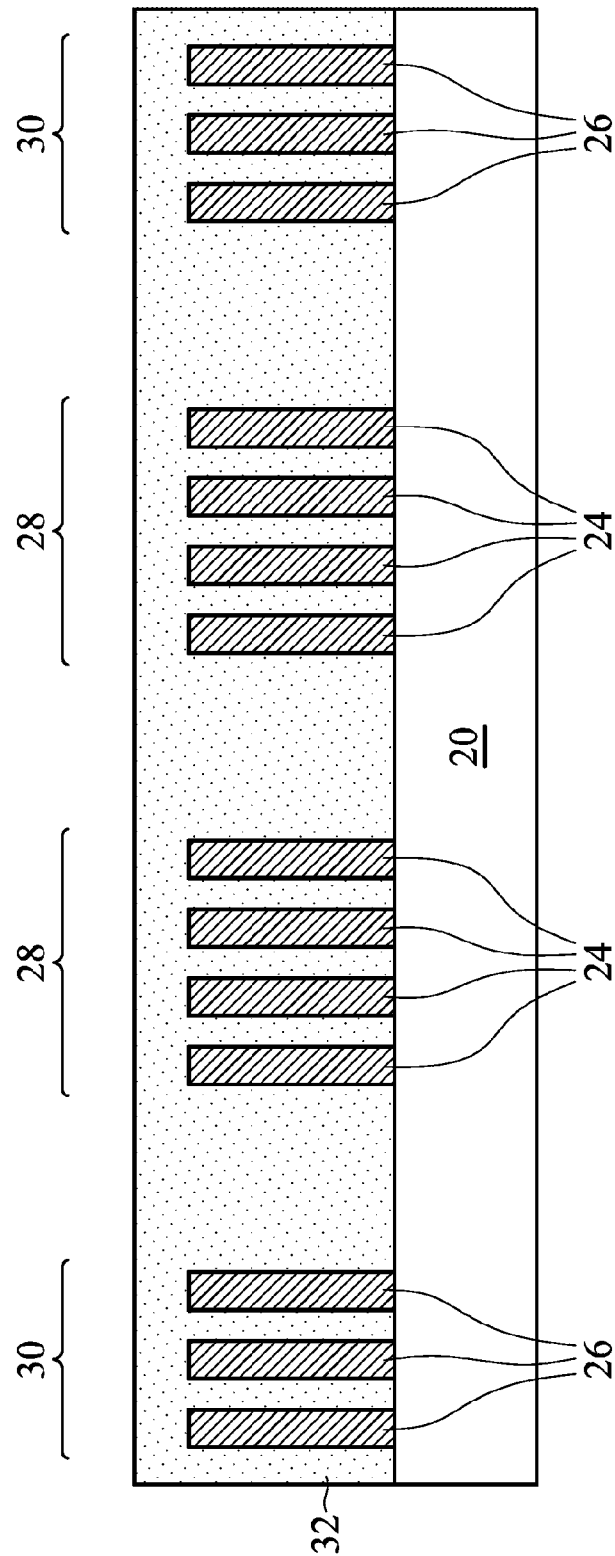

Referring now to FIGS. 3A and 3B, a dielectric layer 32 is blanket deposited on the FinFET device 100. The dielectric layer 32 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The dielectric layer 32 may be deposited through a process such as chemical vapor deposition (CVD), or a spin-on-glass process, although any acceptable process may be utilized.

Figure 4A:
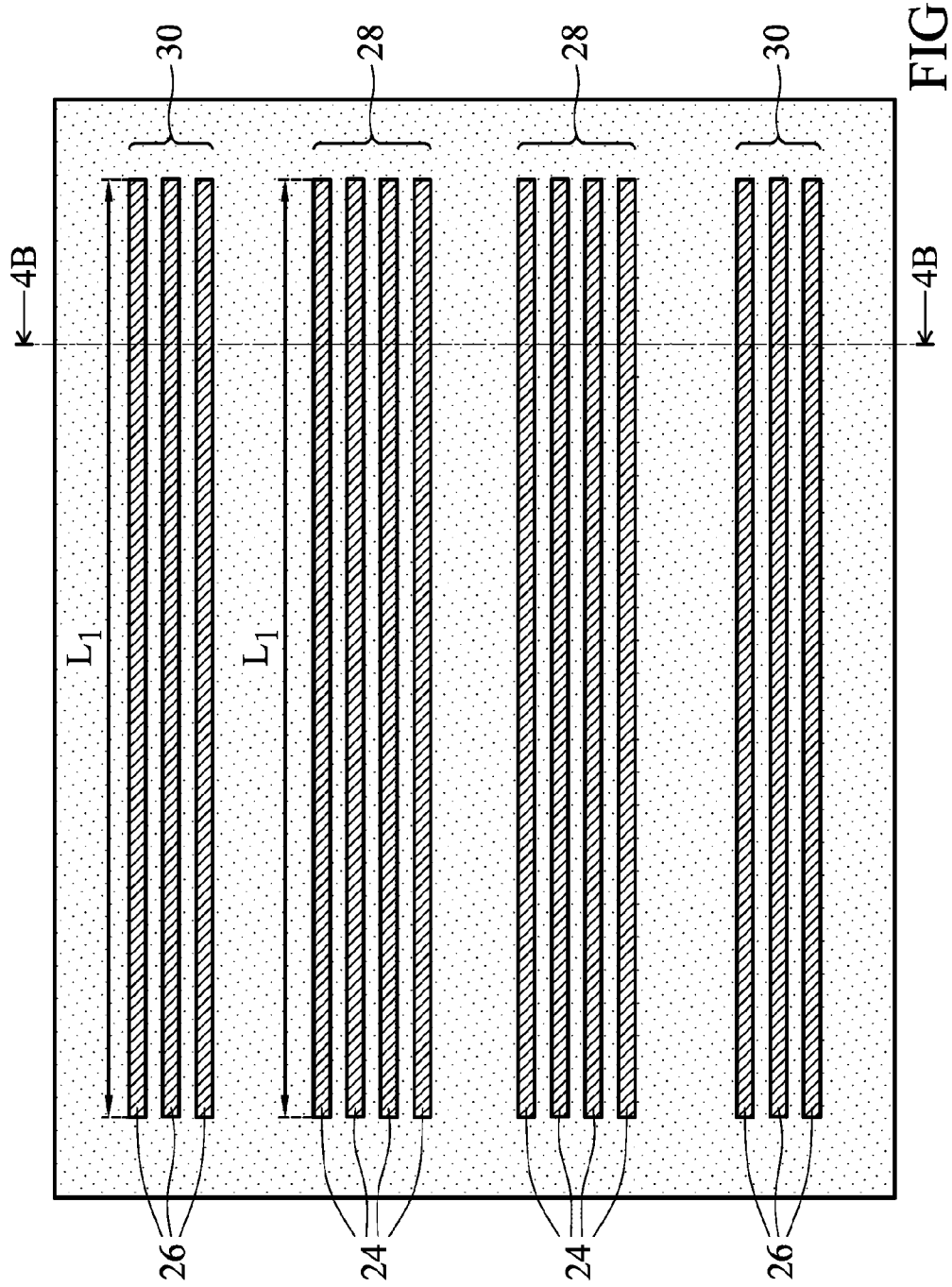
Figure 4B:
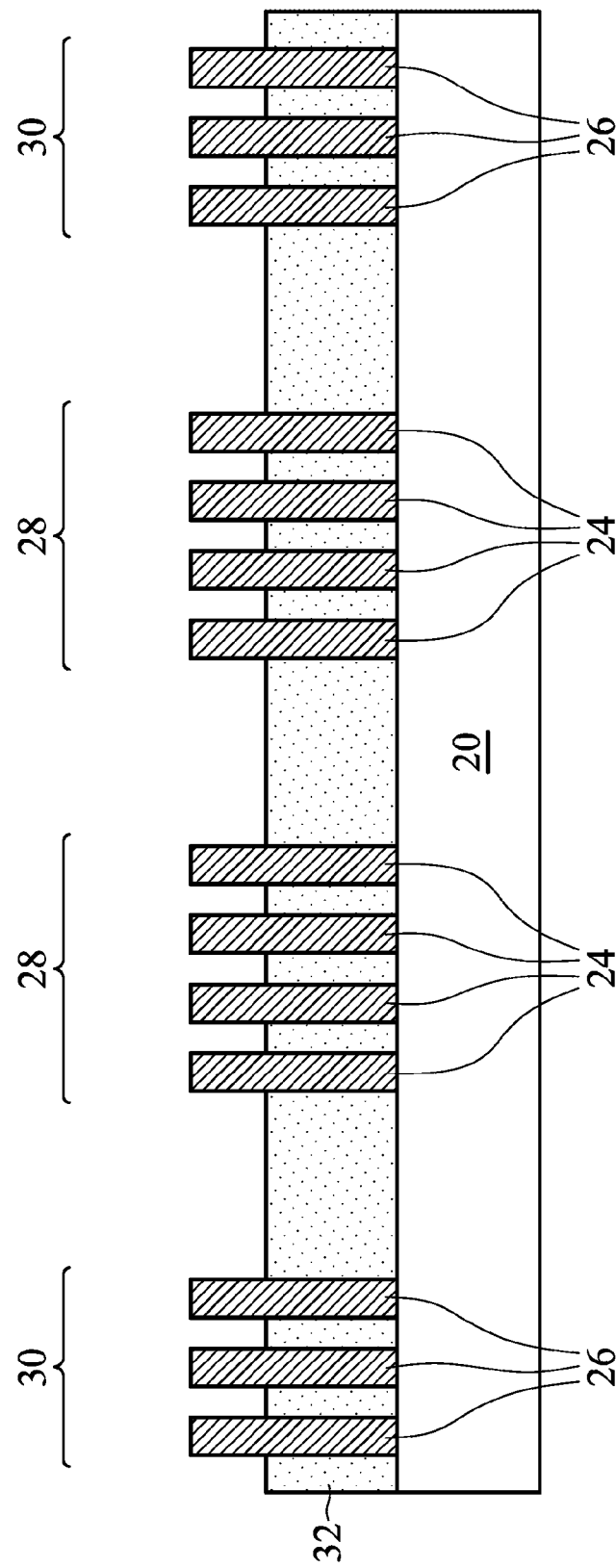

FIGS. 4A and 4B illustrate the next step in the manufacturing process, wherein the dielectric layer 32 is thinned to below the level of the tops of the active fins 24 and the tops of the body contact fins 26. The dielectric layer 32 may be thinned back in a variety of ways. In one embodiment, this is a multi-step process with the first step involving a chemical mechanical polishing (CMP), in which the dielectric layer 32 is reacted and then ground away using an abrasive. This process may continue until the tops of the active fins 24 and the body contact fins 26 are exposed. The next step of thinning the dielectric layer 32 below the tops of the active fins 24 and body contact fins 26 may be performed in a variety of ways. One such way is by a diluted hydrofluoric acid (DHF) treatment or a vapor hydrofluoric acid (VHF) treatment for a suitable time. In another embodiment, the CMP process step may be skipped and the dielectric layer 32 may be selectively thinned back without removing the active fins 24 and the body contact fins 26. This selective thinning may be performed by the DHF treatment or the VHF treatment described above.

Figure 5A:
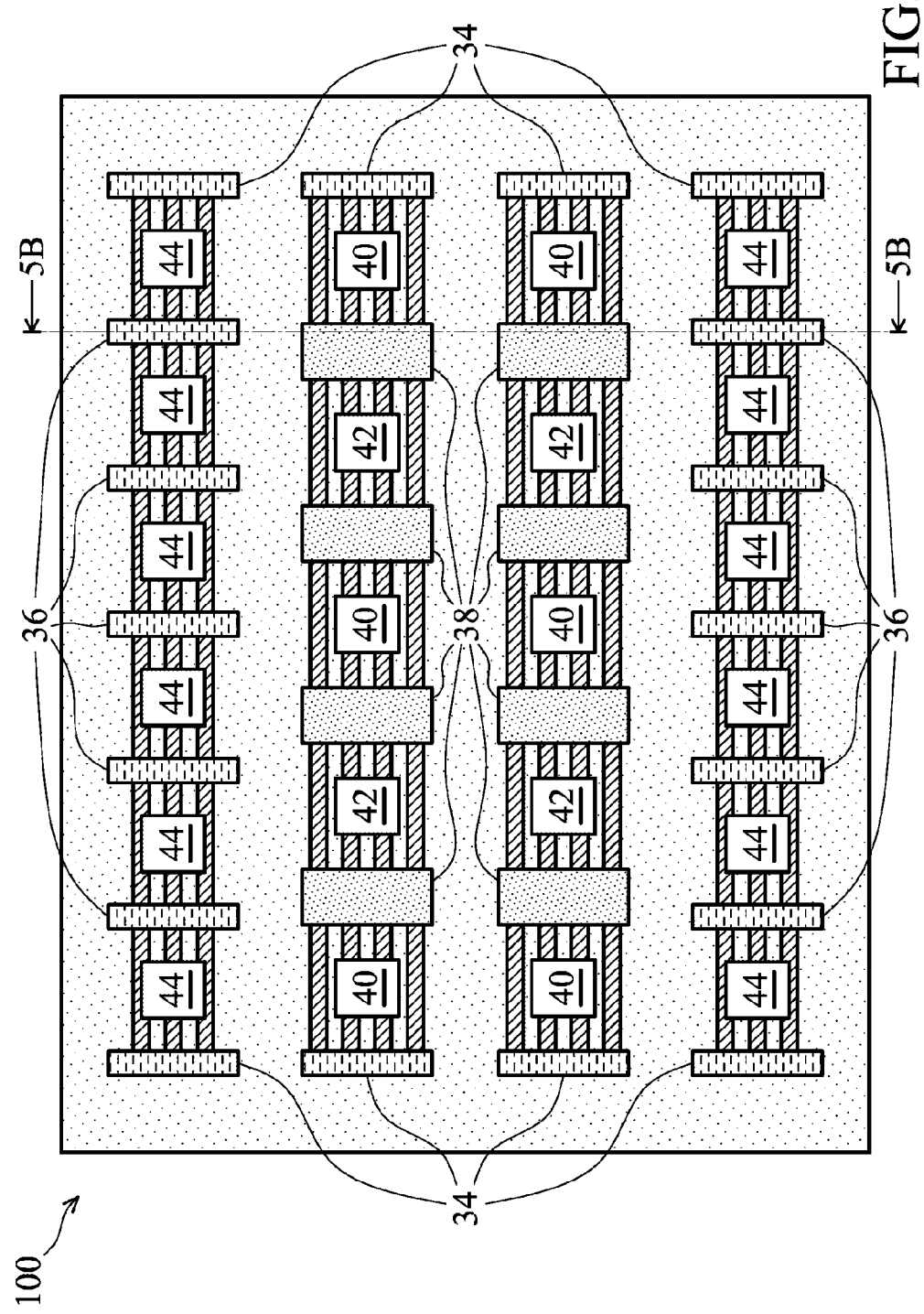
Figure 5B:
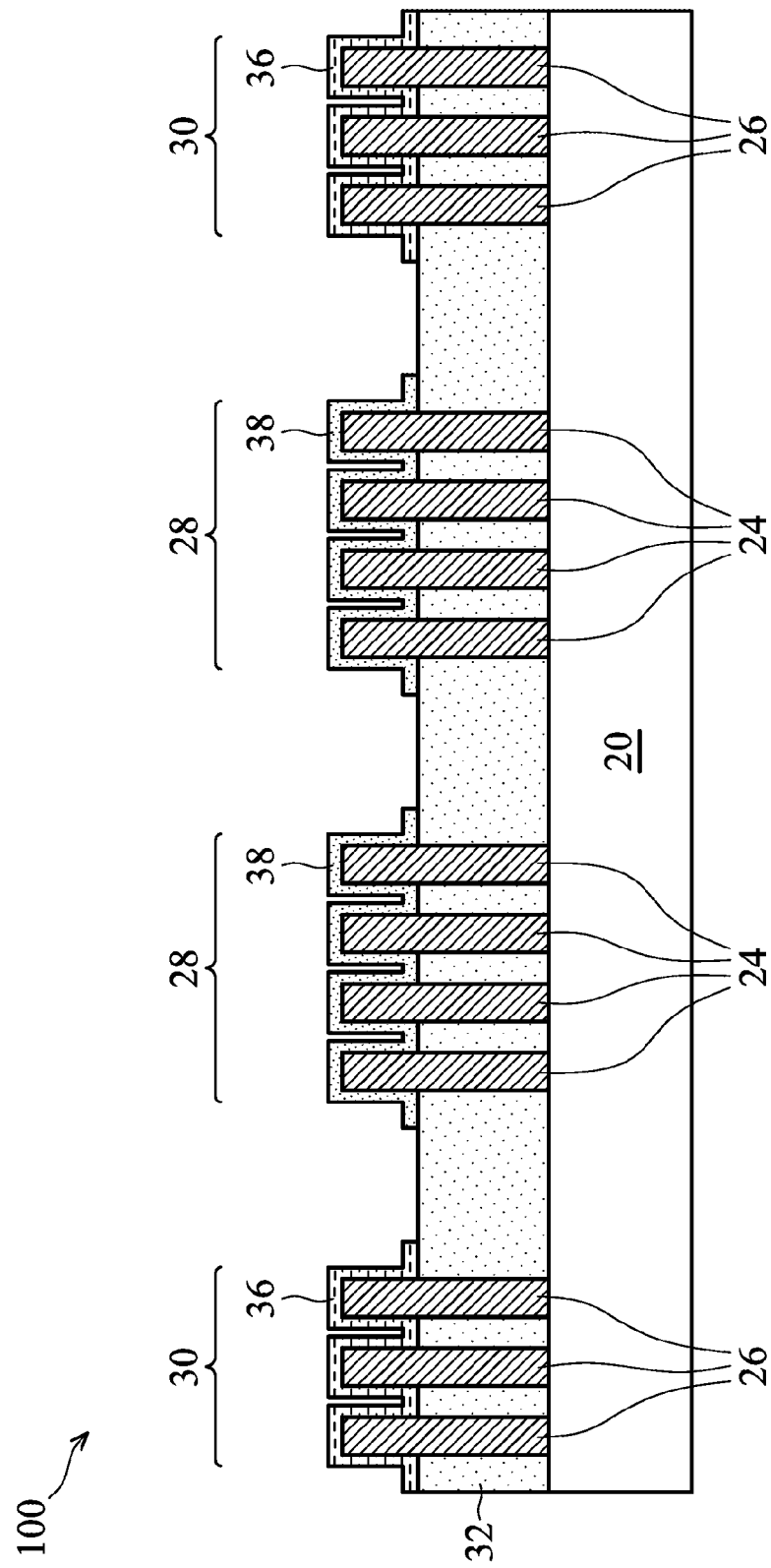

FIGS. 5A and 5B illustrate the formation of the active gates 38 over the active fins 24, the dummy gates 34 over the ends of the active fins 24 and the body contact fins 26, and the dummy gates 36 over the body contact fins 26. The width and length of the dummy gates 34 and 36 may be different than the active gates 38 (see FIG. 5A), or the dummy gates 34 and 36 may have a same width and length as the active gates 38. The active gates 38 and the dummy gates 34 and 36 may include a gate dielectric layer (not shown), a gate electrode (not shown), and gate spacers (not shown). The gate dielectric layer may be formed by thermal oxidation, CVD, sputtering, or any other methods known and used in the art for forming a gate dielectric. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The gate electrode layer may be formed over the gate dielectric layer. The gate electrode layer may comprise a conductive material and may be selected from a group comprising polycrystalline-silicon (poly-Si), poly-crystalline silicon-germanium (poly-SiGe), metallic nitrides, metallic silicides, metallic oxides, and metals. The gate electrode layer may be deposited by CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques. The gate electrode layer and the gate dielectric layer may be patterned to form the active gates 38 and the dummy gates 34 and 36. The gate patterning process may be accomplished by depositing mask material (not shown) such as photoresist or silicon oxide over the gate electrode layer. The mask material is then patterned and the gate electrode layer is etched in accordance with the pattern.

After the formation of the active gates 38 and the dummy gates 34 and 36, source regions 40 and the drain regions 42 may be formed on the active fins 24. The source regions 40 and the drain regions 42 may be doped by performing implanting process to implant appropriate dopants to complement the dopants in the active fins 24. In another embodiment, the source regions 40 and the drain regions 42 may be formed by forming recesses (not shown) in active fins 24 and epitaxially growing material in the recesses. The source regions 40 and the drain regions 42 may be doped either through an implantation method as discussed above, or else by in-situ doping as the material is grown. The dummy gates 34 over the ends of the active fins 24 and the body contact fins 26 may be used to control the epitaxial growth of the source regions 40 and the drain regions 42 as well as the body contacts 44. In an embodiment, a continuous metal layer may overly the four active fins 24 in each of the source regions 40 to form three source regions 40 in each FinFET 28. Further, a continuous metal layer may overly the four active fins 24 in each of the drain regions 42 in each of the drain regions 42 to form two drain regions in each of the FinFETs 28.

In the embodiment illustrated in FIGS. 5A and 5B, the FinFETs 28 may be configured in a PMOS or an NMOS configuration. In a PMOS configuration, the active fins 24 may be doped with n-type dopants, the body contact fins 26 may be doped with n-type dopants, the source regions 40 and the drain regions 42 may be doped with p-type dopants, and the body contacts 44 may be doped with n-type dopants. In an NMOS configuration, the active fins 24 may be doped with p-type dopants, the body contact fins 26 may be doped with p-type dopants, the source regions 40 and the drain regions 42 may be doped with n-type dopants, and the body contacts 44 may be doped with p-type dopants.

Gate spacers may be formed on opposite sides of the active gates 38 and the dummy gates 34 and 36. The gate spacers (not shown) are typically formed by blanket depositing a spacer layer (not shown) on the previously formed structure.

The spacer layer may comprise SiN, oxynitride, SiC, SiON, oxide, and the like and may be formed by methods utilized to form such a layer, such as CVD, plasma enhanced CVD, sputter, and other methods known in the art. The gate spacers are then patterned, preferably by anisotropically etching to remove the spacer layer from the horizontal surfaces of the structure.

In another embodiment, the source regions 40 and the drain regions 42 may comprise a lightly doped region and a heavily doped region. In this embodiment, before the gate spacers are formed, the source regions 40 and the drain regions 42 may be lightly doped. After the gate spacers are formed, the source regions 40 and the drain regions 42 may then be heavily doped. This forms lightly doped regions and heavily doped regions. The lightly doped regions are primarily underneath the gate spacers while the heavily doped regions are outside of the gate spacers along the active fins 24.

Figure 6B:
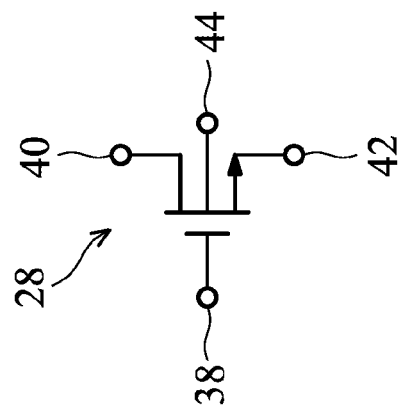
FIGS. 6A and 6B illustrate schematic representations of a PMOS configuration and an NMOS configuration, respectively, of the FinFET device illustrated in FIG. 5A.
Figure 6A:
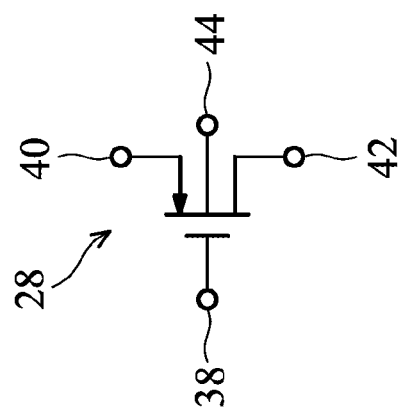

FIGS. 6A and 6B illustrate schematic symbols for a PMOS configuration and an NMOS configuration, respectively, for the FinFETs 28 as shown in FIGS. 5A and 5B. Both of the schematic symbols illustrate the active gate 38 connected to the gate terminal, the source region 40 connected to the source terminal, the drain region 42 connected to the drain terminal, and the body contact 44 connected to the body terminal.

Figure 7:
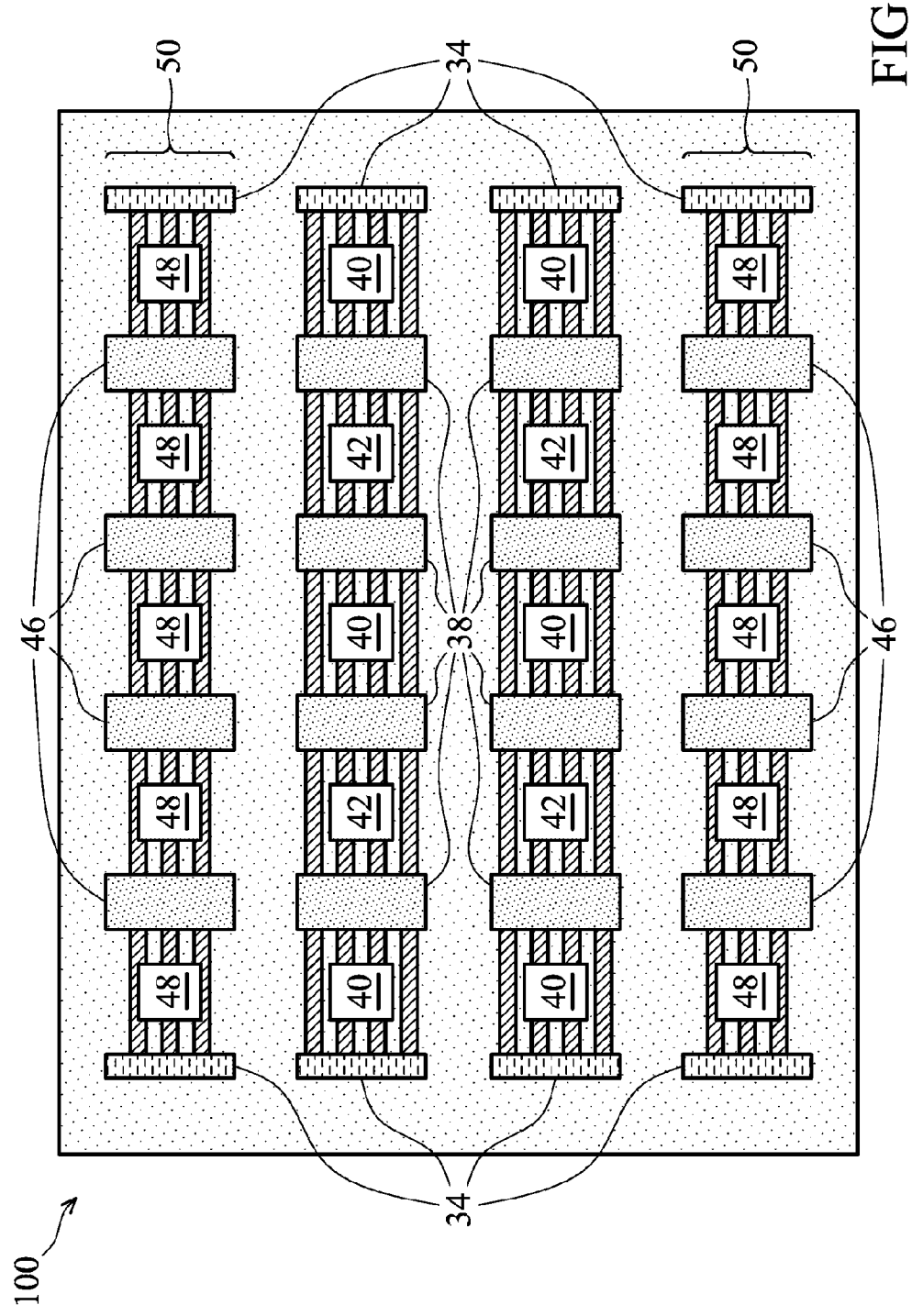
FIG. 7 illustrates in top-down view a FinFET device with an embedded varactor according to another embodiment.

FIG. 7 illustrates another embodiment of FinFET device 100 wherein the body contact fins 26 have active gates 46 formed over them. The width and length of the active gates 46 may be different than the active gates 38, or the active gates 46 may have a same width and length as the active gates 38 (see FIG. 7). The active gates 46 over the body contact fins 26 may form an embedded MOS varactor 50 which may act as a decoupling capacitor. In an embodiment where the embedded MOS varactor 50 is configured to act as a decoupling capacitor, the active gates 46 may be connected to a bias node, which may vary the capacitance of the embedded MOS varactor 50. Additionally, in an NMOS configuration of the embedded MOS varactor 50, the active gates 46 may be connected to a ground node to act as a decoupling capacitor. In a PMOS configuration of the embedded MOS varactor 50, the active gates 46 may be connected to a power node to act as a decoupling capacitor.

In the embodiment illustrated in FIG. 7, the FinFETs 28 and the embedded MOS varactors 50 may each be configured in a PMOS or an NMOS configuration. In an embodiment wherein the FinFETs 28 are PMOS and the embedded MOS varactors 50 are NMOS, the active fins 24 may be doped with n-type dopants, the body contact fins 26 may be doped with n-type dopants, the source regions 40 and the drain regions 42 may be doped with p-type dopants, and the body contacts 48 may be doped with n-type dopants. In another embodiment wherein the FinFETs 28 are NMOS and the embedded MOS varactors 50 are PMOS, the active fins 24 may be doped with p-type dopants, the body contact fins 26 may be doped with p-type dopants, the source regions 40 and the drain regions 42 may be doped with n-type dopants, and the body contacts 44 may be doped with p-type dopants.

Figure 8A:
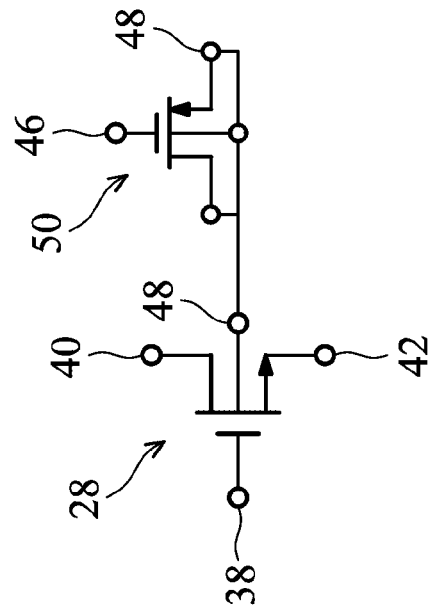
FIGS. 8A and 8B illustrate schematic representations of a PMOS configuration and an NMOS configuration, respectively, of the FinFET device illustrated in FIG. 7.
Figure 8B:
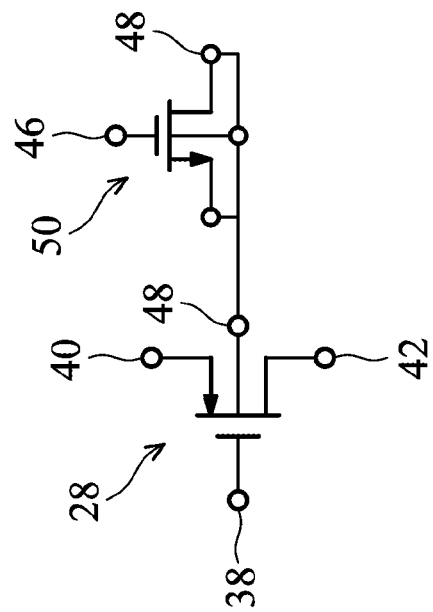

FIGS. 8A and 8B illustrate schematic symbols for PMOS and NMOS configurations for the FinFETs 28 and embedded MOS varactors 50 as shown in FIG. 7. In FIG. 8A, the FinFET 28 is PMOS and the embedded MOS varactor 50 is NMOS. In FIG. 8B, the FinFET 28 is NMOS and the embedded MOS varactor 50 is PMOS. Both of the schematic symbols illustrate the active gate 38 connected to the gate terminal of the FinFETs 28, the source region 40 connected to the source terminal of the FinFETs 28, the drain region 42 connected to the drain terminal of the FinFETs 28, and the body contact 48 connected to the body terminal of the FinFETs 28. In an embodiment wherein the FinFET 28 is PMOS and the embedded MOS varactor 50 is NMOS (see FIG. 8A), the active gates 46 may be connected to a bias node or a ground node to form a decoupling capacitor. In another embodiment wherein the FinFET 28 is NMOS and the embedded MOS varactor 50 is PMOS (see FIG. 8B), the active gates 46 may be connected to a bias node or a power node to form a decoupling capacitor.

By replacing the dummy gates 36 with active gates 46 over the body contact fins 26 to form embedded MOS varactors 50, the cost of the FinFET device 100 is reduced because the material for the active gates 46 may be utilized, for example, as decoupling capacitors. Additionally, the total area of the FinFET device 100 may be reduced by embedding necessary capacitors into the already existing structure of the body contact fins 26 and the gates over the body contact fins.

An embodiment is semiconductor device comprising a first FinFET over a substrate, wherein the first FinFET comprises a first set of semiconductor fins. The semiconductor device further comprises a first body contact for the first FinFET over the substrate, wherein the first body contact comprises a second set of semiconductor fins, and wherein the first body contact is laterally adjacent the first FinFET.

Another embodiment is a FinFET device comprising a first FinFET over a substrate, the first FinFET comprising a first plurality of fins, and at least two active gates over the first plurality of fins. The FinFET device further comprises a first body contact for the first FinFET over the substrate, the first body contact comprising a second plurality of fins, and at least two active gates over the second plurality of fins.

Yet another embodiment is a method for forming a FinFET device, the method comprising forming a first FinFET comprising forming a first plurality of fins over a substrate, forming at least two active gates over the first plurality of fins, and forming at least two source regions and at least two drain regions in the first plurality of fins. The method further comprises forming a first body contact for the first FinFET comprising forming a second plurality of fins over the substrate forming at least two dummy gates over the second plurality of fins, and forming at least two body contact regions in the second plurality of fins.

According to an embodiment, a semiconductor device includes a first FinFET over a substrate, wherein the first FinFET comprises a first fin, and a first body contact for the first FinFET over the substrate, wherein the first body contact comprises a second fin, and wherein the second fin is parallel to the first fin. The semiconductor device further includes a first active gate and a second active gate over the second fin, wherein a first body contact region is interposed between the first active gate and the second active gate.

According to another embodiment, a semiconductor device includes a first FinFET over a substrate. The first FinFET includes a first fin, and a first dummy gate and a second dummy gate over the first fin. The semiconductor device further includes a first body contact for the first FinFET over the substrate. The first body contact includes a second fi, and a third dummy gate and a fourth dummy gate over the second fin, wherein a body contact region is interposed between the third dummy gate and the fourth dummy gate.

According to yet another embodiment, a method for forming a semiconductor device, the method includes forming a first FinFET. Forming the first FinFET includes forming a first fin on a substrate. A first dummy gate and a second dummy gate are formed over the first fin, wherein the first dummy gate and the second dummy gate are separated along a longitudinal axis of the first fin. A first source region and a first drain region are formed in the first fin. The method further includes forming a first body contact for the first FinFET. Forming the first body contact includes forming a second fin on the substrate. A third dummy gate and a fourth dummy gate are formed over the second fin. A first body contact region is formed in the second fin, the first body contact region being interposed between the third dummy gate and the fourth dummy gate.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
    a first FinFET over a substrate, wherein the first FinFET comprises a first fin;
    a first body contact for the first FinFET over the substrate, wherein the first body contact comprises a second fin, and wherein the second fin is parallel to the first fin; and
    a first active gate and a second active gate over the second fin, wherein a first body contact region is interposed between the first active gate and the second active gate.

2. The semiconductor device of claim 1, further comprising:
    a second FinFET over the substrate, wherein the second FinFET comprises a third fin, wherein the third fin is parallel to the first fin, and wherein the second fin is interposed between the first fin and the third fin; and
    a second body contact for the second FinFET over the substrate, wherein the second body contact comprises a fourth fin, wherein the fourth fin is parallel to the first fin, and wherein the third fin is interposed between the second fin and the fourth fin.

3. The semiconductor device of claim 1, further comprising a first dummy gate over the second fin, wherein a second body contact region is interposed between the first dummy gate and the first active gate.

4. The semiconductor device of claim 1, wherein the first fin has a same width and a same length as the second fin.

5. The semiconductor device of claim 1, further comprising a third active gate and a first dummy gate over the first fin, wherein a source region is interposed between the third active gate and the first dummy gate.

6. The semiconductor device of claim 1, further comprising a third active gate and a first dummy gate over the first fin, wherein a drain region is interposed between the third active gate and the first dummy gate.

7. The semiconductor device of claim 1, further comprising a third active gate and a fourth active gate over the first fin, wherein a source region is interposed between the third active gate and the fourth active gate.

8. The semiconductor device of claim 1, further comprising a third active gate and a fourth active gate over the first fin, wherein a drain region is interposed between the third active gate and the fourth active gate.

9. A semiconductor device comprising:
    a first FinFET over a substrate, the first FinFET comprising:
        a first fin; and
        a first dummy gate and a second dummy gate over the first fin; and
    a first body contact for the first FinFET over the substrate, the first body contact comprising:
        a second fin; and
        a third dummy gate and a fourth dummy gate over the second fin, wherein a body contact region is interposed between the third dummy gate and the fourth dummy gate.

10. The semiconductor device of claim 9, further comprising:
    a second FinFET over the substrate, the second FinFET comprising:
        a third fin; and
        a first active gate and a second active gate over the third fin; and
    a second body contact for the second FinFET over the substrate, the second body contact comprising:
        a fourth fin; and
        a third active gate and a fourth active gate over the fourth fin, wherein the first fin, the second fin, the third fin, and the fourth fin are parallel to each other.

11. The semiconductor device of claim 10, wherein the third active gate and the fourth active gate are electrically coupled to a bias node thereby forming a decoupling capacitor.

12. The semiconductor device of claim 10, wherein the third active gate and the fourth active gate are electrically coupled to a power node thereby forming a decoupling capacitor.

13. The semiconductor device of claim 9, wherein the first FinFET further comprises a first active gate and a second active gate over the first fin, and wherein the first active gate and the second active gate are interposed between the first dummy gate and the second dummy gate.

14. The semiconductor device of claim 9, wherein the first body contact further comprises a first active gate and a second active gate over the second fin, and wherein the first active gate and the second active gate are interposed between the third dummy gate and the fourth dummy gate.

15. The semiconductor device of claim 9, wherein the first FinFET further comprises a source region and a drain region, and wherein the source region and the drain region are interposed between the first dummy gate and the second dummy gate.

16. A method for forming a semiconductor device, the method comprising:
    forming a first FinFET comprising:
        forming a first fin on a substrate;
        forming a first dummy gate and a second dummy gate over the first fin, wherein the first dummy gate and the second dummy gate are separated along a longitudinal axis of the first fin; and
        forming a first source region and a first drain region in the first fin; and forming a first body contact for the first FinFET comprising:
   forming a second fin on the substrate;
   forming a third dummy gate and a fourth dummy gate over the second fin; and
   forming a first body contact region in the second fin, the first body contact region being interposed between the third dummy gate and the fourth dummy gate.

17. The method of claim 16, further comprising:
forming a second FinFET comprising:
   forming a third fin on the substrate;
   forming a first active gate and a second active gate over the third fin; and
   forming a second source region and a second drain region in the third fin; and
forming a second body contact for the second FinFET comprising:
   forming a fourth fin on the substrate;
   forming a third active gate and a fourth active gate over the fourth fin; and
   forming a second body contact region in the fourth fin, the second body contact region being interposed between the third active gate and the fourth active gate.

18. The method of claim 16, wherein forming the first FinFET further comprises forming an active gate over the first fin, the active gate being interposed between the first source region and the first drain region.

19. The method of claim 16, wherein forming the first body contact further comprises forming an active gate over the second fin, the active gate being interposed between the third dummy gate and the fourth dummy gate.

20. The method of claim 16, wherein forming the first body contact further comprises:
   forming a fifth dummy gate over the second fin; and
   forming a second body contact region in the second fin, the fifth dummy gate being interposed between the first body contact region and the second body contact region.

\* \* \* \* \*